(12) United States Patent
Shajii et al.

(10) Patent No.: US 7,166,187 B2
(45) Date of Patent: Jan. 23, 2007

(54) SEGMENTED COLD PLATE FOR RAPID THERMAL PROCESSING (RTP) TOOL FOR CONDUCTION COOLING

(75) Inventors: Ali Shajii, Canton, MA (US); David Tao, Saugus, MA (US); Mathias Koch, Andover, MA (US); Douglas Brown, South Hamilton, MA (US); Hossein Zarrin, Winchester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 402 days.

(21) Appl. No.: 10/879,463

(22) Filed: Jun. 29, 2004

(65) Prior Publication Data

US 2005/0026447 A1   Feb. 3, 2005

Related U.S. Application Data

(62) Division of application No. 10/228,788, filed on Aug. 27, 2002, now Pat. No. 6,783,630.

(51) Int. Cl.
*H01L 21/00* (2006.01)
*C23C 16/00* (2006.01)

(52) U.S. Cl. ............ 156/345.53; 156/345.51; 156/345.52; 156/345.54; 118/724; 118/725; 118/728; 219/444.1; 219/544; 392/416; 392/418; 204/192.1; 204/298.01

(58) Field of Classification Search ......... 156/345.53, 156/345.51, 345.52, 345.54; 118/724, 725, 118/728; 219/444.1, 544; 392/416, 418; 204/192.1, 298.01
See application file for complete search history.

(56) References Cited

U.S. PATENT DOCUMENTS

| | | | |
|---|---|---|---|
| 5,802,856 A | * | 9/1998 | Schaper et al. ............... 62/3.7 |
| 5,810,933 A | | 9/1998 | Mountsier et al. |
| 6,186,090 B1 | | 2/2001 | Dotter, II et al. |
| 6,188,044 B1 | | 2/2001 | Lee et al. |
| 6,231,716 B1 | | 5/2001 | White et al. |
| 6,276,072 B1 | | 8/2001 | Morad et al. |
| 6,353,209 B1 | * | 3/2002 | Schaper et al. .......... 219/444.1 |
| 6,357,143 B1 | | 3/2002 | Morad et al. |
| 6,403,925 B1 | | 6/2002 | Johnsgard et al. |
| 6,435,797 B1 | * | 8/2002 | Mittermaier et al. ........ 414/180 |
| 2002/0011478 A1 | | 1/2002 | Ratliff et al. |
| 2002/0177094 A1 | * | 11/2002 | Shirakawa ..................... 432/4 |

\* cited by examiner

*Primary Examiner*—Ram N. Kackar
(74) *Attorney, Agent, or Firm*—Eschweiler & Associates, LLC

(57) ABSTRACT

The present invention is directed to a semiconductor thermal processing system and an apparatus for thermally cooling a semiconductor substrate. According to one aspect of the present invention, a semiconductor thermal processing system and associated apparatus and method are disclosed which provides a segmented cold plate situated within a process chamber, wherein a plurality of segments of the cold plate are operable to radially translate between an engaged position and a disengaged position, wherein a substrate holder may pass between the plurality of segments when the segments are in the disengaged position. According to another aspect, an elevator is operable to linearly translate a substrate residing on a substrate holder between a heating position proximate to a heater assembly and a cooling position proximate to the segmented cold plate. According to another aspect, the cold plate comprises a plurality of holes through which one or more gases may flow, wherein an amount or mixture of the one or more gases is controllable via a controller, and wherein one or more temperature sensors are operable to provide temperature feedback at the substrate. According to another aspect the substrate resides within close proximity to the cold plate, wherein when gas is flowed through the holes, the substrate is cooled in the viscous regime, and the amount and/or mixture of gases flowed through the holes is controlled, based, at least in part, on the one or more measured temperatures.

7 Claims, 10 Drawing Sheets

US 7,166,187 B2

SEGMENTED COLD PLATE FOR RAPID THERMAL PROCESSING (RTP) TOOL FOR CONDUCTION COOLING

RELATED APPLICATION

This application is a divisional of Ser. No. 10/228,788 filed Aug. 27, 2002, now U.S. Pat. No. 6,783,630, which is entitled "Segmented Cold Plate for Rapid Thermal Processing (RTP) Tool for Conduction Cooling".

FIELD OF THE INVENTION

The present invention relates generally to semiconductor thermal processing systems, and more specifically to a system and an apparatus for rapid thermal processing using a segmented cold plate for cooling a semiconductor substrate.

BACKGROUND OF THE INVENTION

High temperature processing of silicon wafers is important for manufacturing modern microelectronics devices. Such processes, including silicide formation, implant anneals, oxidation, diffusion drive-in and chemical vapor deposition (CVD), may be performed at high temperatures using conventional thermal processing techniques. Furthermore, many microelectronics circuits require feature sizes smaller than one micron and junction depths less than a few hundred angstroms. In order to limit both the lateral and downward diffusion of dopants, as well as to provide a greater degree of control during processing, it is desirable to minimize the duration of high temperature processing.

Semiconductor wafers, flat panel displays and other similar substrates typically have numerous material layers deposited thereon during device fabrication. Some commonly deposited layers (e.g., spin-on glass (SOG) films) may contain contaminants, defects or undesirable microstructures that can be reduced in number or altogether removed by heating or "annealing" the substrate at an appropriate temperature for an appropriate time. Other deposited layers (e.g., copper films) may have properties that undesirably change over time or "self-anneal", resulting in unpredictable deposited layer properties (e.g., unpredictable resistivity, stress, grain size, hardness, etc.). As with contaminants, defects, and undesirable microstructures, deposited layer properties often can be stabilized by a controlled annealing step. Following the annealing step, the substrate preferably is rapidly cooled to stop the annealing process, and so that other processes can be performed on the substrate, in order to increase throughput.

Conventionally, annealing is performed within a quartz furnace that must be slowly pre-heated to a desired annealing temperature, or within a rapid thermal process (RTP) system that can be rapidly heated to a desired annealing temperature. Thereafter, an annealed substrate is transferred to a separate cooling module that conventionally employs a cooled substrate support and is slightly backfilled with a gas such as helium to enhance thermal conduction. The separate cooling module increases equipment cost and complexity, as well as equipment footprint, and decreases substrate throughput by requiring undesirable substrate transfer time between the heating and cooling systems.

Another approach for minimizing processing time utilizes a heat treatment apparatus such as a single-wafer RTP system. Single-wafer rapid thermal processing of semiconductor wafers provides a powerful and versatile technique for fabrication of very-large-scale-integrated (VLSI) and ultra-large-scale-integrated (ULSI) electronic devices. There are several challenges, however, to meeting the thermal requirements of rapid thermal processing. For example, fast rates of change of wafer temperature are typically desired, as well as temperature uniformity across the wafer during the temperature changes.

According to one single-wafer lamp-based RTP system of the prior art, for example, the wafer is vertically translated between a position proximate to a heating lamp and a position proximate to a solid cold plate. When the wafer is translated from the position proximate to the heating lamp to the position proximate to the cold plate, rapid temperature changes occur during what is termed "ramp-down", wherein the temperature of the wafer desirably decreases rapidly to a predetermined temperature. The temperature variation across the wafer during ramp-down, however, should be sufficiently uniform during cooling in order to prevent damage to the wafer such as warpage or cracking. Accordingly, a temperature profile of the cold plate should be substantially uniform across the surface thereof.

According to the exemplary prior art lamp-based RTP system, several translating pins are utilized in order to translate the wafer between the cold plate and the heating lamp, wherein the pins vertically translate through holes in the cold plate, thereby supporting the wafer. In a lamp-based RTP system, however, a distance which the wafer travels between the heat lamp and the cold plate is minimal, since thermal radiation transmitted by the heat lamp can be substantially limited by, for example, cutting power to the heat lamp, or by shielding the wafer by a shutter. Therefore, since the distance of travel between the heating lamp and the cold plate is relatively short, the pins are typically relatively short in length. Consequently, the pins may have significantly small diameters, whereby linear integrity over the short length of the pins can be achieved with the relatively small diameters. Having small diameter pins further minimizes a dimension of the holes in the cold plate, through which the pins translate. Limiting the dimension of the holes in the cold plate is of great concern, since the size of the holes in the cold plate plays a significant role in thermal uniformity across the cold plate during ramp-down. Accordingly, larger holes that may accommodate larger diameter pins may have detrimental effects on the thermal uniformity across the cold plate, and hence, can lead to detrimental effects on the temperature uniformity of the wafer during cooling.

As illustrated in FIG. 1, a simplified lamp-based RTP system 10 of the prior art is depicted, wherein the system comprises a heater lamp 20, a wafer holder assembly 30 and a single-piece cold plate 40. The wafer holder assembly 30 further comprises pins 50 that support the wafer 60, wherein the pins are operable to translate through holes 70 in the cold plate 40 to permit the wafer 60 to be translated between the heater lamp 20 and the cold plate. Typically, a distance between the heater lamp 20 and the cold plate 40 is small (e.g., less than an 20 mm), as discussed above, wherein the diameter of the pins 50 and the holes 70 are respectively small.

The system 10 of the prior art, however may suffer detrimental effects if the distance between the heater lamp 20 and the cold plate 40 is significantly increased. Vertical furnaces, for example, typically translate a wafer over a large distance (e.g., 300 mm or more) within a heater chamber, thereby typically requiring a more robust wafer holder assembly. Furthermore, the substantially solid cold plate 40 utilized in the prior art cannot typically be utilized in a vertical furnace where backside temperature sensing during heating of the wafer is performed. Since a significantly large-diameter hollow elevator shaft (e.g., 10 mm diameter) and accompanying temperature sensing equipment is typically utilized in a vertical furnace RTP chamber, a significantly large hole in the sole cold plate would be needed to accommodate the elevator. Such a large hole would adversely affect the thermal uniformity across the cold plate, and thus, the temperature uniformity across the wafer during cooling.

The conventional cold plate 40 of the prior art may further comprise a plurality of gas ports (not shown) in the cold plate 40 to generally provide a cooling gas to the wafer 60, whereby cooling of the wafer in the molecular flow regime can occur. Cooling in the molecular regime is generally caused by a flowing of gas molecules over a distance which is less than the mean free path for these molecules. However, cooling of the wafer 60 in the molecular flow regime generally limits an ability to fine-tune a temperature profile across the wafer 60.

Therefore, for at least the above-mentioned reasons, an improved cold plate for a vertical furnace RTP system and a method for cooling a wafer is needed to alleviate many of the problems associated with the prior art.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed to a semiconductor thermal processing system and apparatus for thermally cooling a semiconductor substrate. The thermal processing system is operable to efficiently cool a substrate in a generally uniform manner across the substrate, thereby improving process control. According to one aspect of the present invention, a semiconductor thermal processing system and associated apparatus are disclosed which provide efficient and uniform cooling by a segmented cold plate.

A thermal process chamber is disclosed, wherein a substrate holder residing within the thermal process chamber is operable to vertically transport a semiconductor substrate between a heating position proximate to a heater assembly and a cooling position proximate to the cold plate. In one example, the cold plate comprises a plurality of radially-moveable segments, wherein the plurality of segments are operably coupled to a radial translation device. The radial translation device is operable to radially translate each of the plurality of segments between an engaged position and a disengaged position, wherein the engaged position generally defines a contiguous surface of the cold plate, and wherein the plurality of segments generally contact with one another. In the disengaged position, a plurality of gaps are defined between each of the plurality of segments when the plurality of segments are radially extended.

According to another aspect of the invention, an elevator operably coupled to the substrate holder is operable to vertically translate the substrate between the heating position and cooling position, wherein the plurality of segments of the cold plate are in the engaged position when the substrate is in the cooling position. Furthermore, when the substrate is moved from the cooling position to the heating position, the plurality of segments are operable to move into the disengaged position, such that the substrate holder can pass through the plurality of gaps between the plurality of segments. A controller is furthermore disclosed, wherein the controller is operable to control a vertical position of the substrate holder and a radial position of the plurality of segments.

According to yet another exemplary aspect of the invention, the cold plate comprises a plurality of holes adapted to allow one or more gases to flow through the cold plate in order to selectively allow thermal conduction in the viscous regime between the substrate and the cold plate. According to still another aspect, the thermal processing system further comprises one or more temperature sensors for detecting one or more temperatures associated with one or more regions of the substrate. A tunable gas source is also disclosed, wherein the tunable gas source is operable to selectively supply one or more gases to the plurality of holes in the cold plate, wherein an amount of the one or more gases supplied to the cold plate is controlled by the controller, and wherein the control is based, at least in part, on the one or more measured temperatures.

According to another exemplary aspect of the present invention, a method for cooling a substrate in a thermal processing system is disclosed, wherein the thermal processing system comprises a segmented cold plate. The method comprises lowering a substrate holder to a cooling position, wherein the substrate holder passes though one or more gaps between a plurality of segments of the cold plate, and wherein the substrate is brought within close proximity the cold plate. The segments of the cold plate are subsequently moved into an engaged position, wherein the segments move radially inward, thereby defining a generally contiguous cold plate. The substrate is then cooled by thermal conduction of heat from the substrate to the cold plate.

According to still another exemplary aspect of the invention, one or more temperatures associated with one or more regions of the substrate are measured, and one or more gases are flowed through holes in the cold plate, whereby thermal conduction in the molecular regime between the substrate and the cold plate can be augmented. An optimum mixture of the one or more gases can be determined based, at least in part, on the one or more measured temperatures, and an amount of the one or more gases can be modified to reflect the optimum mixture for each of the one or more regions.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
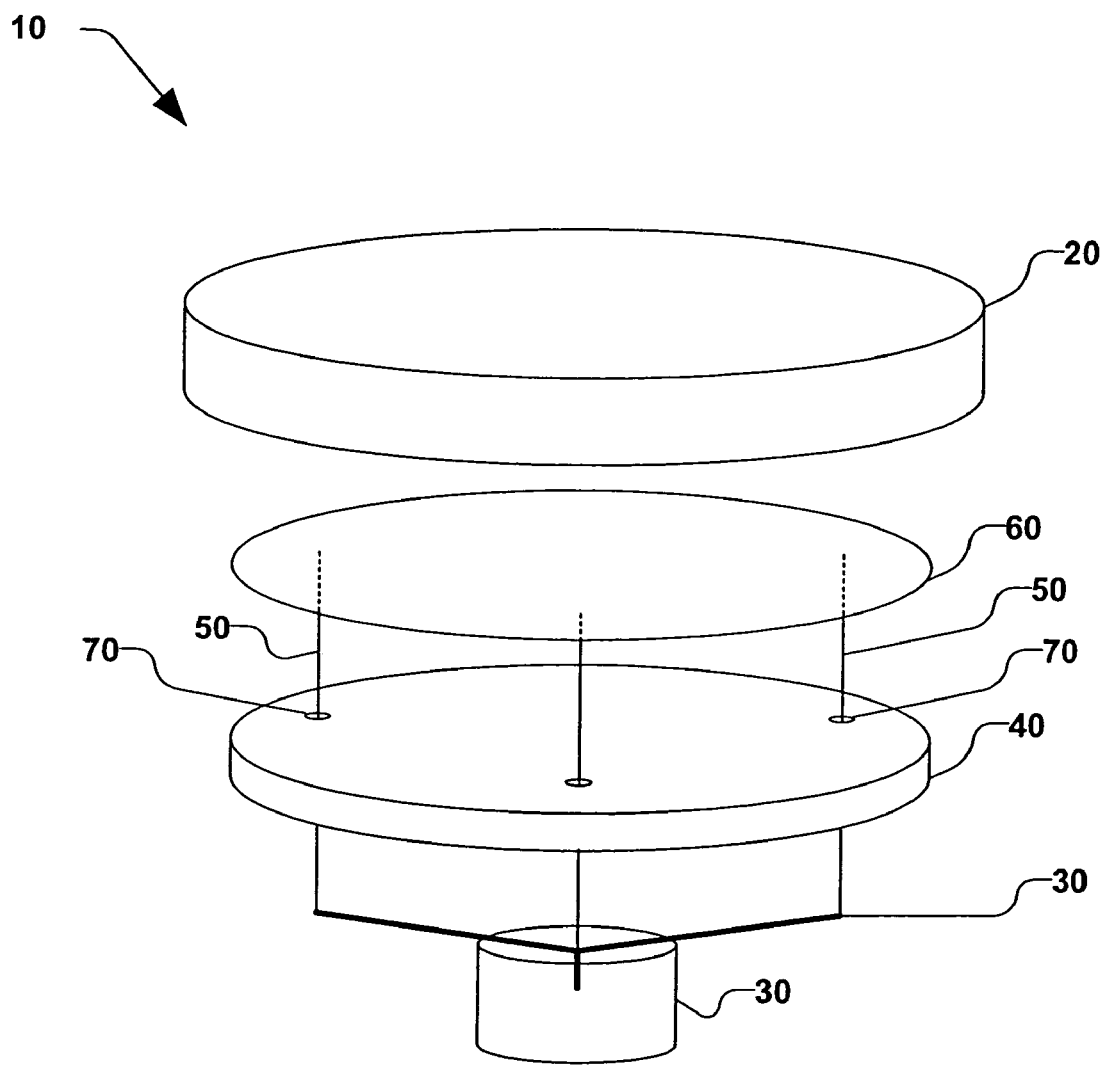
FIG. 1 is a partial perspective view of a thermal processing system illustrating a cold plate of the prior art.

The present invention is directed towards a rapid thermal processing (RTP) system and an associated method and apparatus that incorporates several inventive features that improve the thermal processing system, reduce variations in a thermal profile associated with the RTP system, and improve process control therein. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 2:
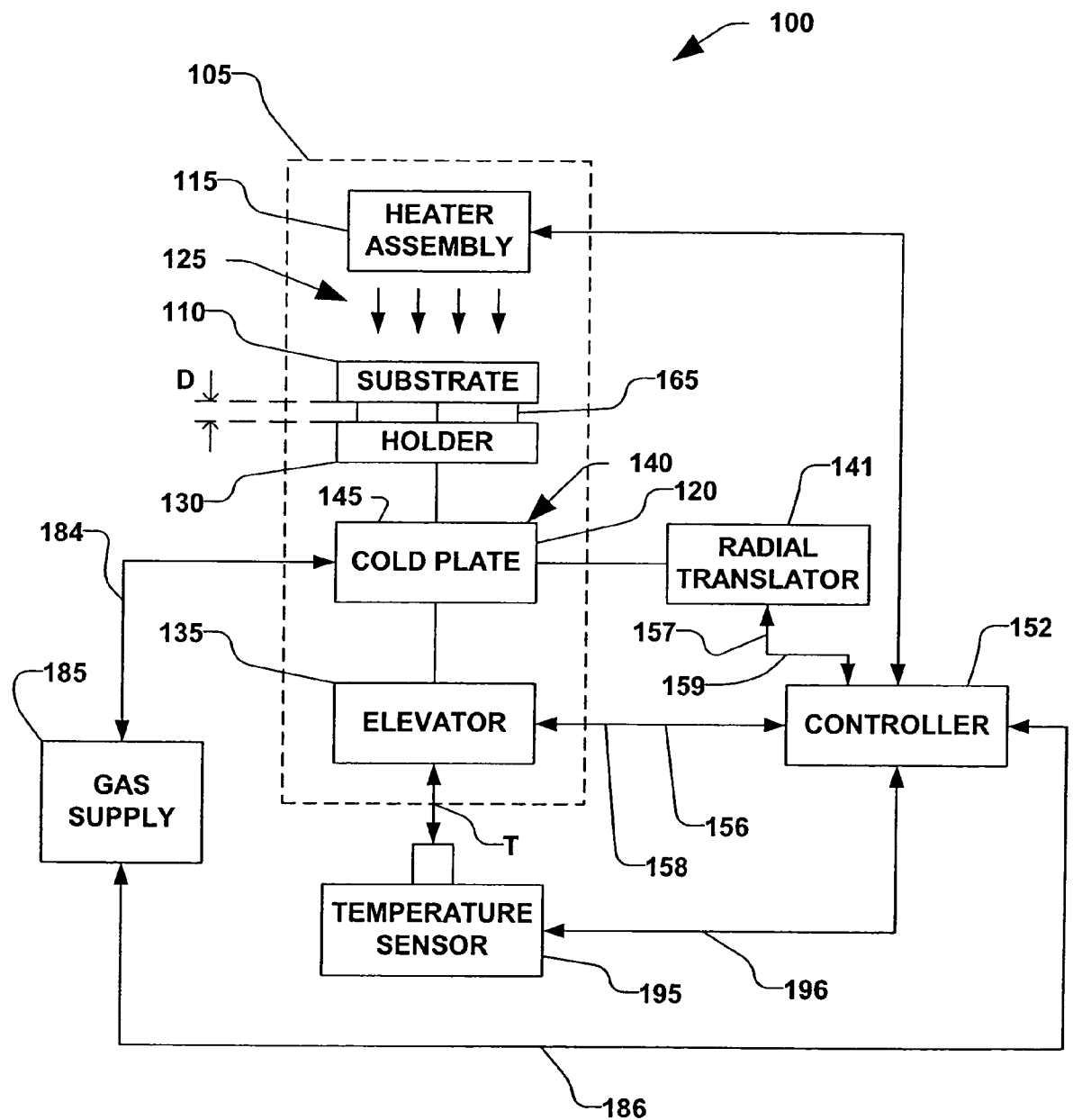
FIG. 2 is a system level block diagram of a thermal processing system according to one aspect of the present invention.

One exemplary aspect of the present invention provides a thermal processing system comprising a cold plate, wherein a semiconductor substrate is operable to translate between a heater assembly and the cold plate to accelerate a thermal process. FIG. 2 illustrates an exemplary thermal processing system 100 comprising a process chamber 105, wherein a semiconductor substrate 110 such as a silicon wafer is thermally treated therein. The process chamber 105 comprises a heater assembly 115 and a cold plate 120 disposed therein, wherein the heater assembly is operable to substantially heat the substrate 110, and the cold plate is operable to substantially cool the substrate during thermal processing. The heater assembly 115, for example, is operable to transmit thermal radiation 125 toward the substrate 110, wherein the thermal radiation is operable to substantially heat the substrate 110 when the substrate is proximate to the heater assembly. Typically, the thermal processing system 100 produces a temperature at the substrate 110 that is generally adjustable across a wide range of temperatures (e.g., from about 400° C. to about 1200° C.).

The substrate 110, for example, resides on a vertically-translating substrate holder 130, wherein the substrate holder is operably coupled to an elevator 135. The elevator 135 is operable to vertically translate the substrate holder 130, and hence, the substrate 110 residing thereon, between the heating position proximate to the heater assembly 115 and a cooling position proximate to the cold plate 120. The elevator 135, for example, comprises a stepper motor, electro-mechanical drive motor, a pneumatic motor, or a lead screw that is operable to linearly translate the substrate holder 130.

According to one exemplary aspect of the present invention, the cold plate 120 is axisymmetric with the substrate 110, and comprises a plurality of radially-moveable segments 140. Each of the segments 140, for example, are comprised of a thermally-conductive material such as aluminum, copper, or a metal alloy. Furthermore, each of the segments may comprise a protective coating thereon such as quartz, wherein the cold plate 120 is substantially inert with respect to process temperatures or gases utilized during processing. A radial translation device 141 operably coupled to the plurality of radially-moveable segments 140 is operable to radially translate each of the plurality of segments with respect to a center (not shown) of the cold plate 120. The radial translation device 141 comprises, for example, a stepper motor, electro-mechanical drive motor, pneumatic motor, or a gear assembly configured to radially translate each of the plurality of segments 140.

Figure 3A:
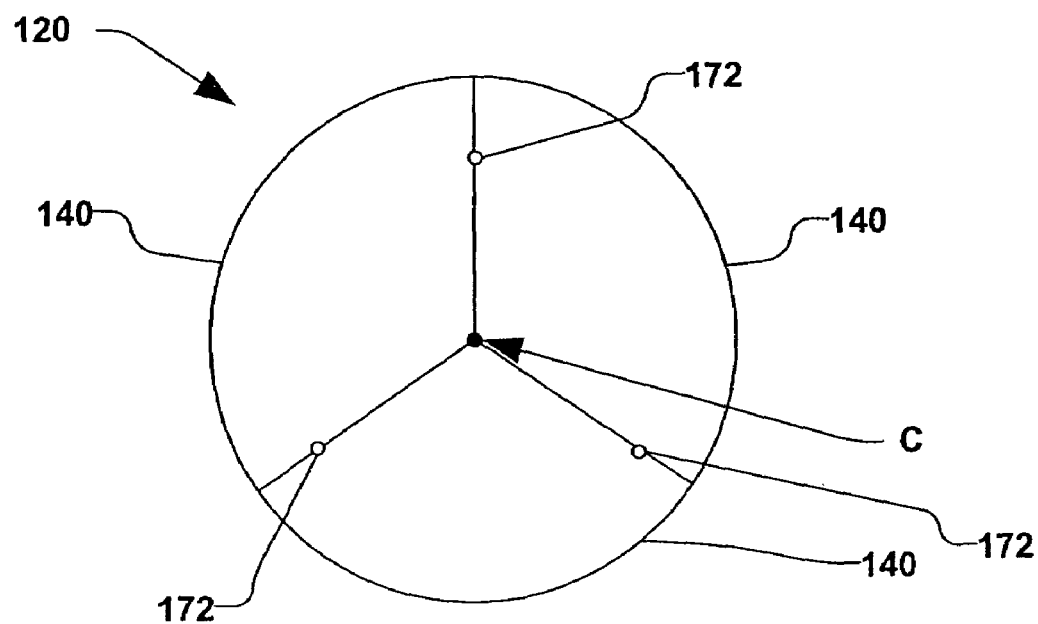
FIG. 3A is a plan view illustrating an exemplary cold plate in an engaged position according to the one aspect of the present invention.
Figure 3B:
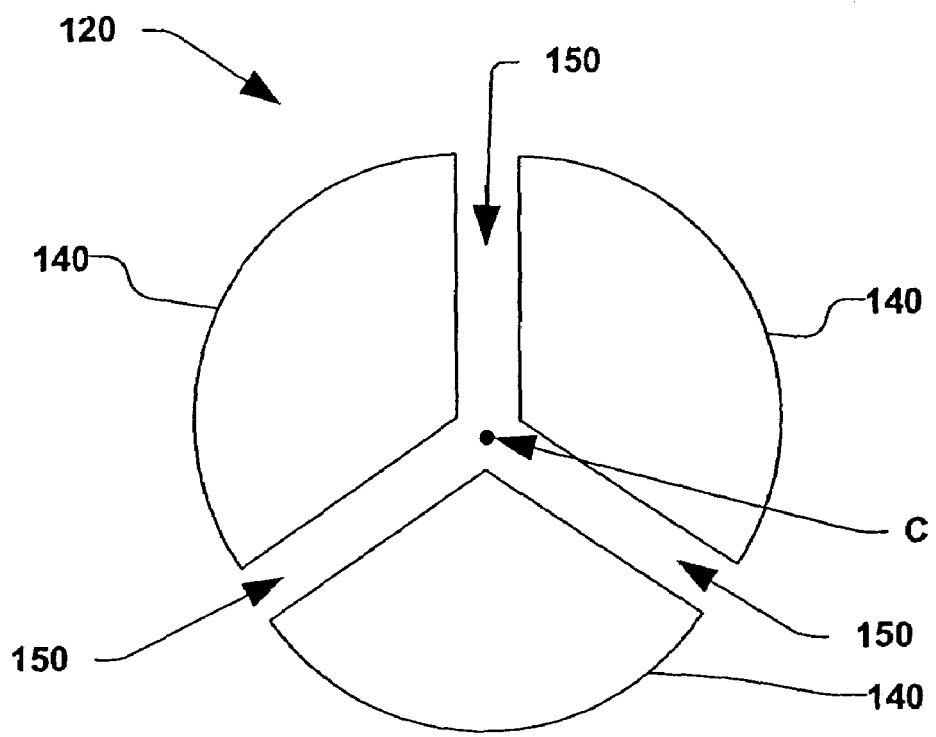
FIG. 3B is a plan view illustrating an exemplary cold plate in a disengaged position according to the one aspect of the present invention.

FIG. 3A, for example, illustrates a cold plate 120 comprising three radially-moveable segments 140 in an engaged position, wherein the plurality of segments contact one another at one or more interfaces 142, thereby defining a generally contiguous surface 145 of the cold plate 120. The segments 140 furthermore are operable to converge at a center C of the cold plate 120. FIG. 3B illustrates the exemplary radially-moveable segments 140 of FIG. 3A which have been moved by the radial translation device 141 of FIG. 2 into a disengaged position, wherein a gap 150 is defined between each of the radially-moveable segments 140. A size of the gap 150, for example, may be determined by a size or configuration of the substrate holder 130, as will described hereafter.

Referring again to FIG. 2, a controller 152 is operably coupled to the elevator 135 and the radial translation device 141, wherein the controller is operable to control a vertical position of the substrate holder 130 via the elevator, and is furthermore operable to control a radial position of the plurality of segments 140 of the cold plate 120 via the radial translation device 141. According to one example, the elevator 135 and the radial translation assembly 141 are operably coupled by a coupling mechanism, whereby a linear translation of the elevator causes a radial translation of the plurality of segments 140 of the cold plate 120.

The elevator 135, for example, further comprises a linear position sensing system (not shown), wherein a linear position of the elevator, and hence a vertical position of the substrate holder 130 in the process chamber 105 is sensed, and linear position data 156 is sent back to the controller 152. Likewise, the radial translation assembly 141, for example, comprises a radial position sensor (not shown) operable to sense a radial position of the segments 140, and is further operable to transmit radial position data 157 to the controller 152. The controller 152, for example, is operable to independently control the vertical position of the elevator 135 and the radial position of the plurality of segments (not shown) of the cold plate 120, based, at least in part, on the linear position data 156 and the radial position data 157. Furthermore, the controller 155 is operable to provide linear control data 158 and radial control data 159 to the respective elevator 135 and the radial translation assembly 141, wherein the linear control data and radial control data is determined based upon at least the linear position data 156 and the radial position data 157. The controller 155 is further operable to control the radial position of the plurality of segments 140, wherein the plurality of segments are in the disengaged position of FIG. 3B when the substrate 110 is in the heating position proximate to the heater assembly 115, and wherein the plurality of segments are in the engaged position of FIG. 3A when the substrate is in the cooling position proximate to the cold plate 120.

Figure 4:
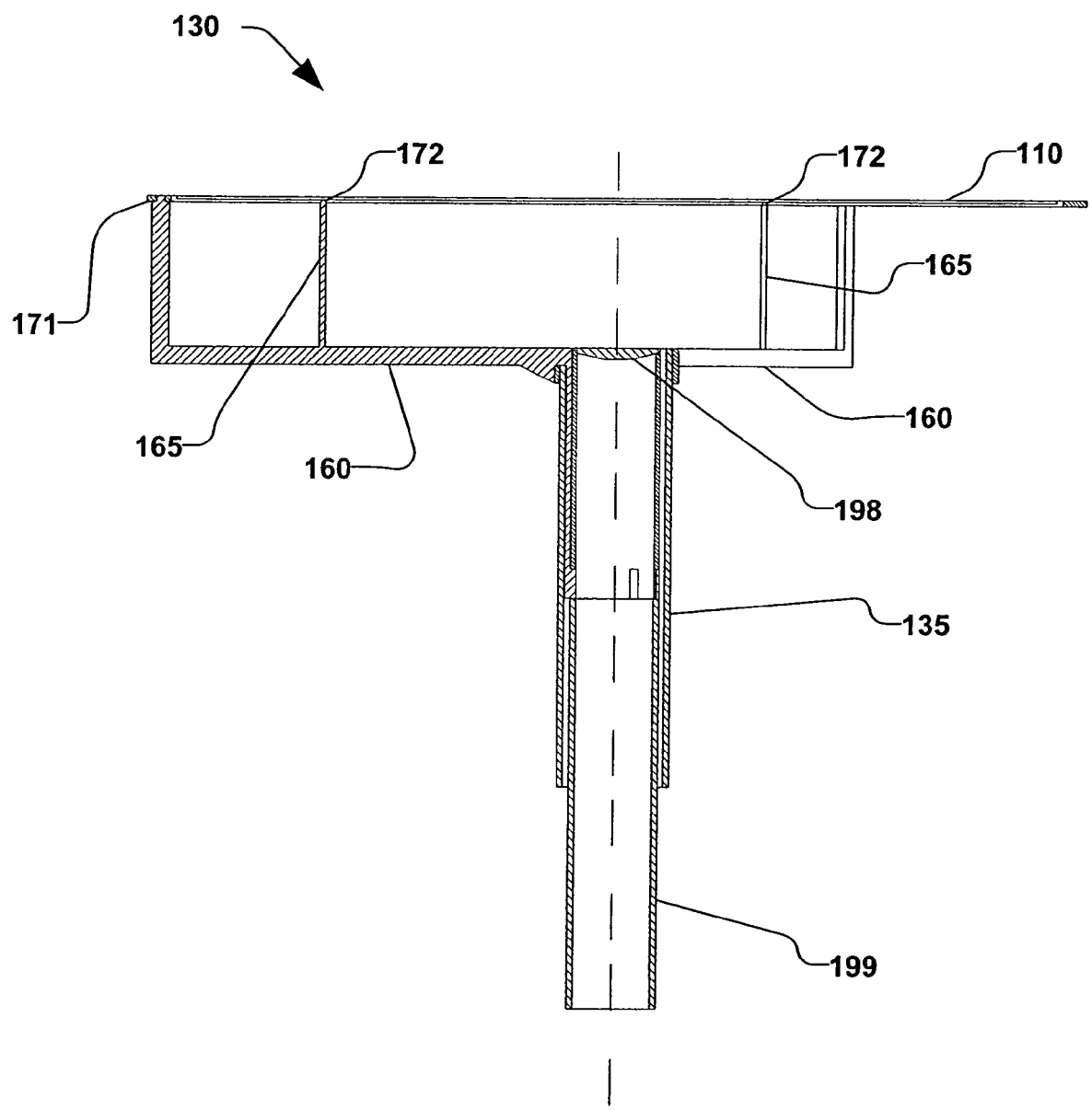
FIG. 4 is a partial cross-sectional view of an exemplary substrate holder according to one aspect of the present invention.

According to one example, FIG. 4 illustrates a partial cross-sectional view of an exemplary substrate holder 130 operably coupled to an exemplary elevator 135, wherein the substrate holder comprises a plurality of arms 160 extending radially from the elevator. In the example of FIG. 4, the elevator 135 comprises an elevator tube 199 having a lens 198 situated at a top portion thereof. The lens 198 operates in conjunction with a pyrometer head (not shown) at a bottom portion of the elevator tube 199 to provide an indication of the wafer temperature during, for example, a heating of the substrate 110. The substrate holder 130 comprises three arms radiating from the elevator 135 at 120° angles from one another. Each of the plurality of arms 160 further comprises one or more vertically-extending pins 165, whereon the substrate 110 generally resides. For example, three pins 165 extend vertically from the respective three arms 160, wherein a tip 170 of each pin contacts the substrate 110. The pins 165, for example, are comprised of quartz, silicon carbide, or a ceramic material, wherein contamination of the substrate 110 from the pins during heating is minimized. Furthermore, the pins 165 have a generally small diameter (e.g., 1 or 2 mm) which will significantly limit localized thermal conduction between the pins and the substrate 110, especially with rounded or coned pin tips, as will be understood by one of ordinary skill in the art. According to another example, the substrate holder 130 further comprises an edge ring 171 which is coaxial with the substrate 110, wherein the edge ring has a diameter which is slightly greater than the substrate, and wherein the edge ring is operable to aid in radial temperature uniformity of the substrate or work piece 110.

Figure 5:
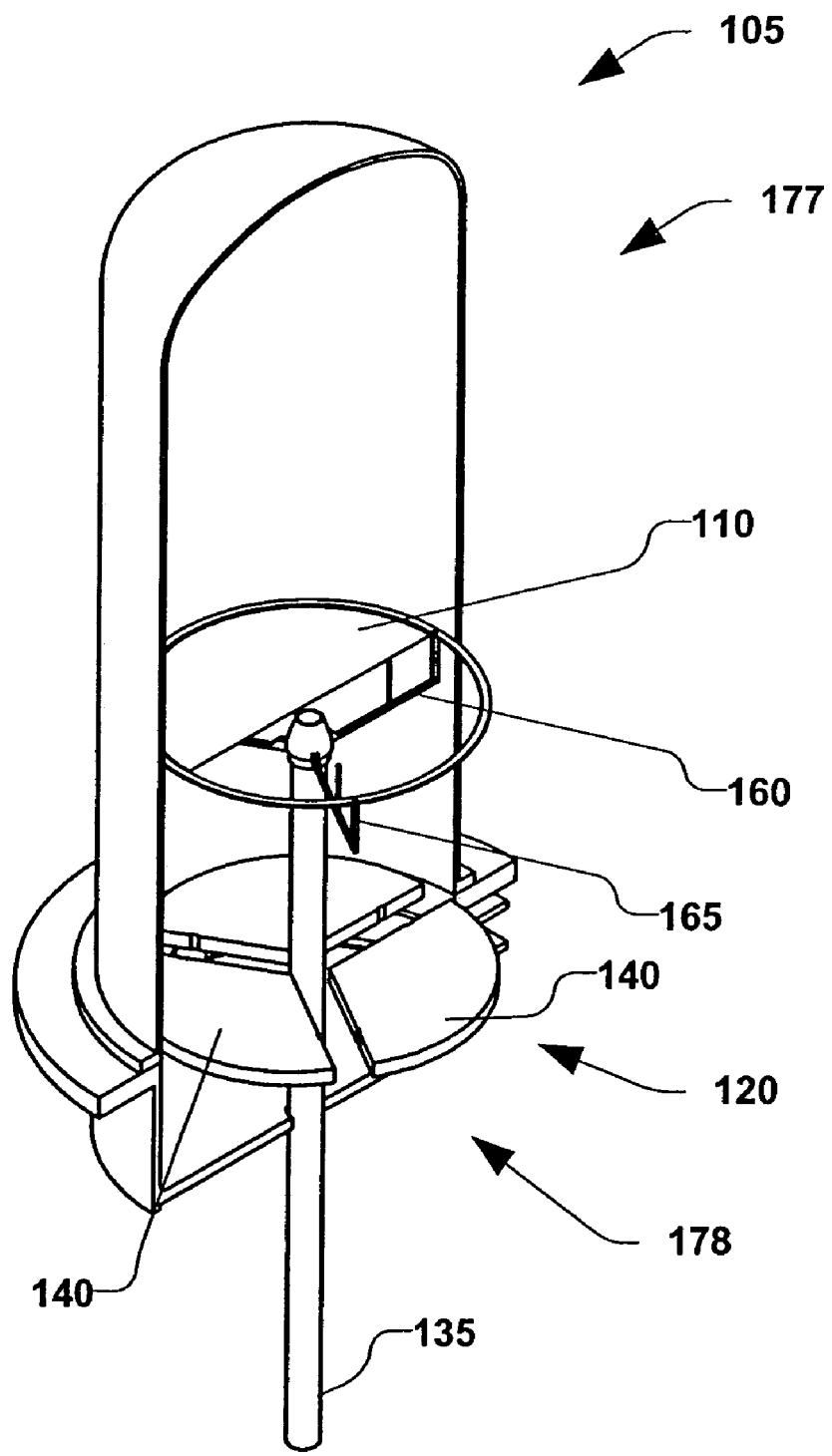
FIG. 5 is a partial perspective view of an exemplary thermal processing system in a heating position according to one aspect of the present invention.

According to another exemplary aspect of the present invention, FIG. 3A further illustrates the plurality of segments 140 of the cold plate 120, wherein each of the segments comprise one or more notches 172 associated with the one or more pins 165 of FIG. 4. As illustrated in FIG. 5, the plurality of arms 160 of the substrate holder 130 are furthermore operable to translate from a first region 177 above the cold plate 120 of FIG. 2 to a second region 178 below the cold plate when the plurality of segments 140 are in the disengaged position.

Figure 6:
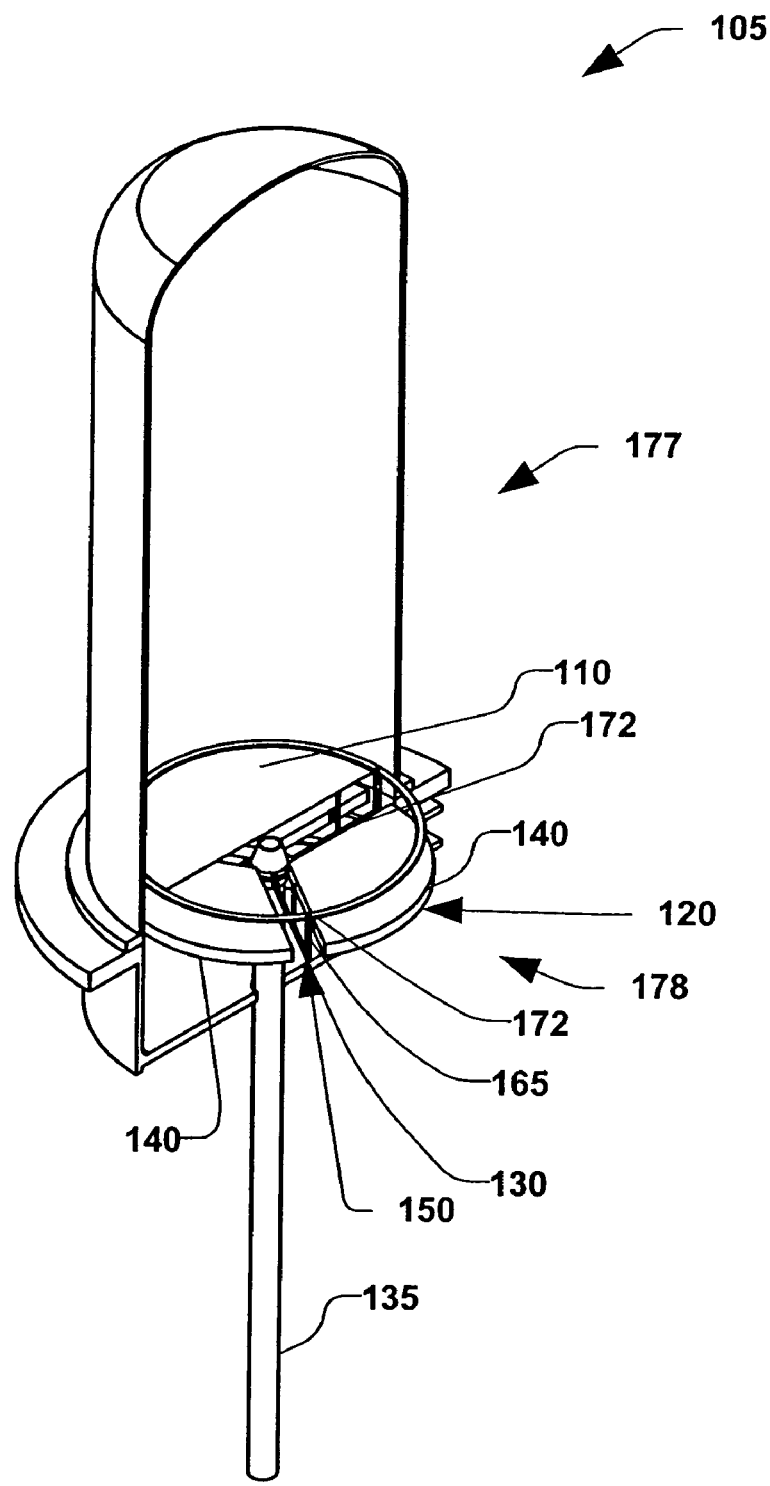
FIG. 6 is a partial perspective view of an exemplary thermal processing system in a translating position proximate to a segmented cold plate according to one aspect of the present invention.
Figure 7:
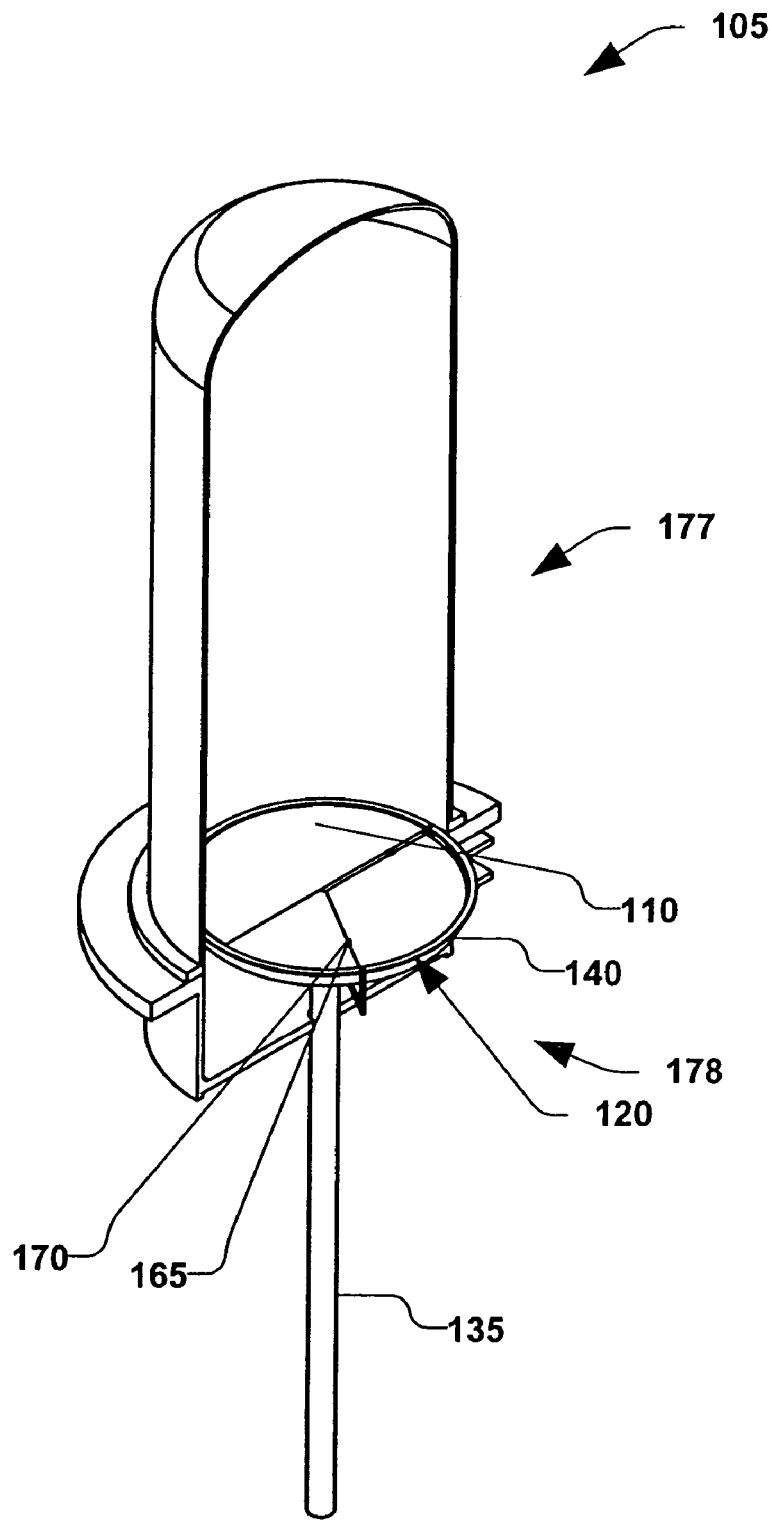
FIG. 7 is a partial perspective view of an exemplary thermal processing system in a cooling position according to one aspect of the present invention.
Figure 8:
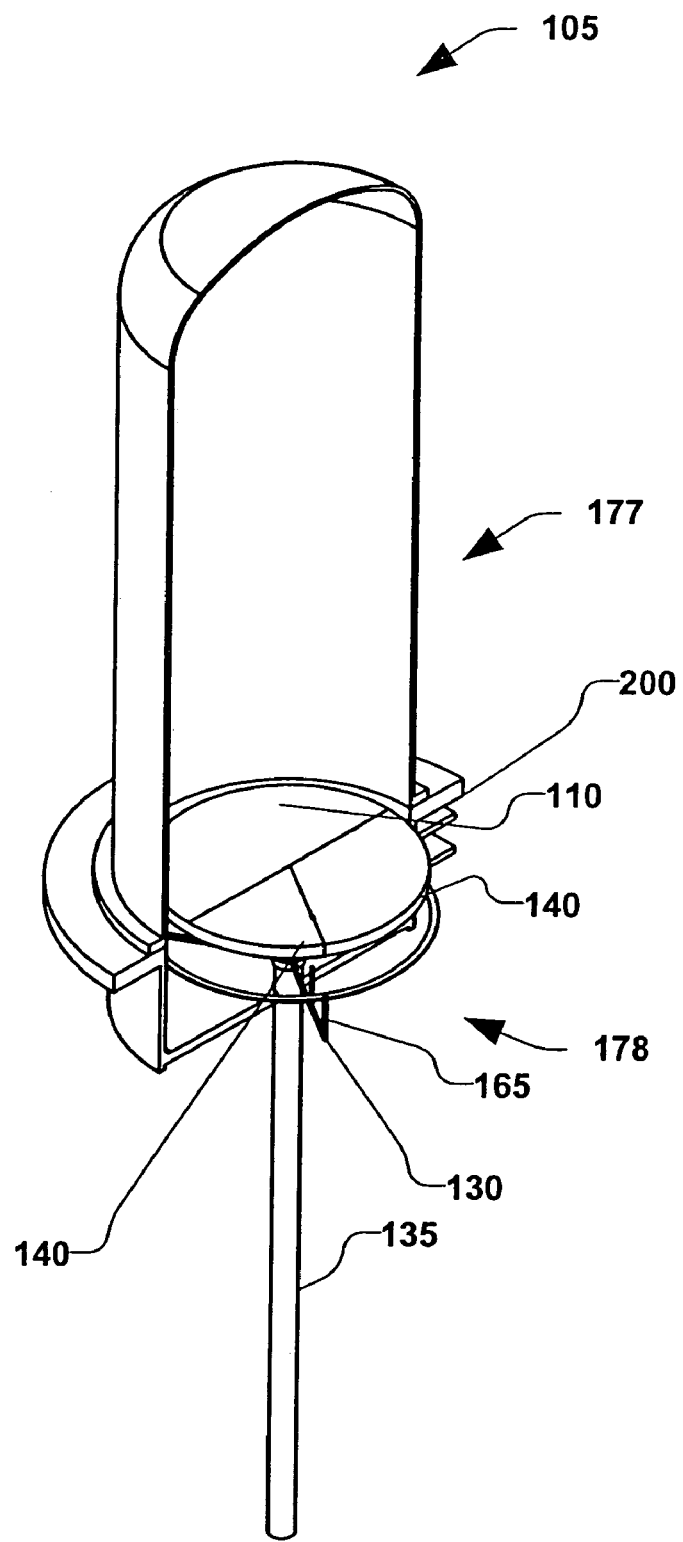
FIG. 8 is a partial perspective view of an exemplary thermal processing system in a cooling position wherein the substrate resides on the cold plate according to one aspect of the present invention.

FIG. 6 illustrates the substrate holder 130 in the second region 178 with the plurality of segments in the disengaged position. When the plurality of arms 160 are below the cold plate 120, the one or more notches 172 are adapted to permit the plurality of segments 140 to be moved into the engaged position, wherein each of the one or more pins 165 associated with each of the plurality of arms 160 are operable to pass through the one or more notches. In other words, the plurality of arms 160 may pass through the gaps 150 between the plurality of segments 140 when the cold plate 120 is in the disengaged position of FIG. 3B, and each of the plurality of pins 165 may furthermore protrude through the one or more notches 172 when the plurality of segments 140 are in the engaged position of FIG. 3A. FIG. 7 illustrates the plurality of segments 140 of the cold plate 120 in the engaged position, wherein the plurality of pins 165 protrude through the plurality of notches 172, thereby supporting the substrate 110 above the cold plate 120. The elevator 135 is further operable to position the substrate 110 within close proximity (e.g., less than 1 mm) to the cold plate 120. Alternatively, the substrate holder 130 is operable to place the substrate 110 in contact with the cold plate 120, as illustrated in FIG. 8 whereby the tips 170 of each of the pins 165 translate below the surface 145 of the cold plate 120.

Consequently, such a segmented cold plate 120 is advantageous over the prior art since a substrate holder 130 as illustrated in FIG. 4 having arms 160 and associated pins 165 would not permissibly translate through a solid cold plate of the prior art.

Figure 9:
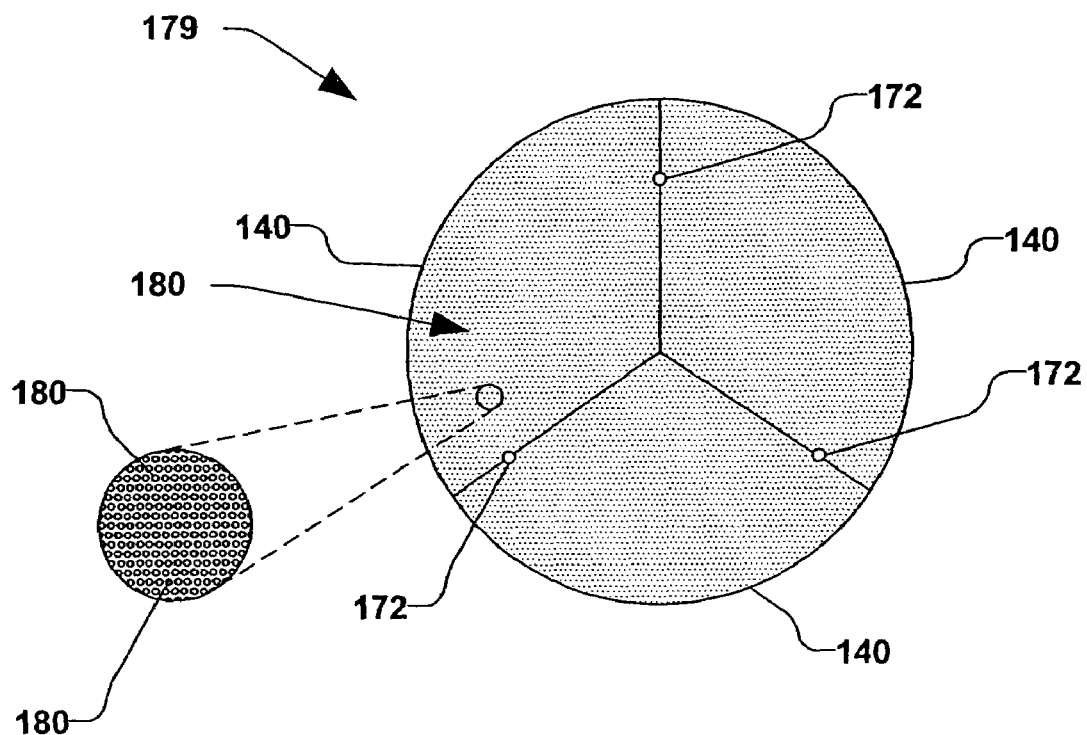
FIG. 9 is a simplified plan view of an exemplary cold plate comprising gas ports in an engaged position according to the one aspect of the present invention.

According to another exemplary aspect of the present invention, as illustrated in FIG. 9, each of the plurality of segments 140 of a cold plate 179 comprises a plurality of holes 180, wherein each of the plurality of holes is adapted to allow one or more gases (not shown) to flow therethrough. The one or more gases, for example, comprise one or more of substantially thermally conductive and thermally non-conductive gases, such as helium, argon, and nitrogen. As illustrated in FIG. 2, the one or more gases 184 are supplied to the cold plate 179 by a tunable gas source 185, wherein the tunable gas source is furthermore operable to receive gas flow control signals 186 from the controller 152, and wherein the controller is operable to control a flow of the one or more gases to the cold plate via controlling the tunable gas source. Furthermore, each segment 140 of the cold plate 120, for example, comprises one or more conduits (not shown) for transporting a cooling fluid such as water therethrough, thereby cooling the cold plate, as will be understood by one of ordinary skill in the art.

Although the cold plate 179 having the holes 180 may be segmented as illustrated in FIG. 9, the cold plate need not be segmented, and such an alternative is contemplated as falling within the scope of the present invention. In addition, for each hole 180 extending through the cold plate 179 which provides gas to the work piece 110, another hole may be employed as a return for carrying gas which has increased in temperature due to its thermal conduction with the wafer, away from the wafer, respectively. Lastly, although the holes 180 of FIG. 9 are illustrated as circular holes, the holes are intended to include a variety of shapes such as axial slots, radial slots, etc., and any shape hole is contemplated as falling within the scope of the present invention.

Figure 10:
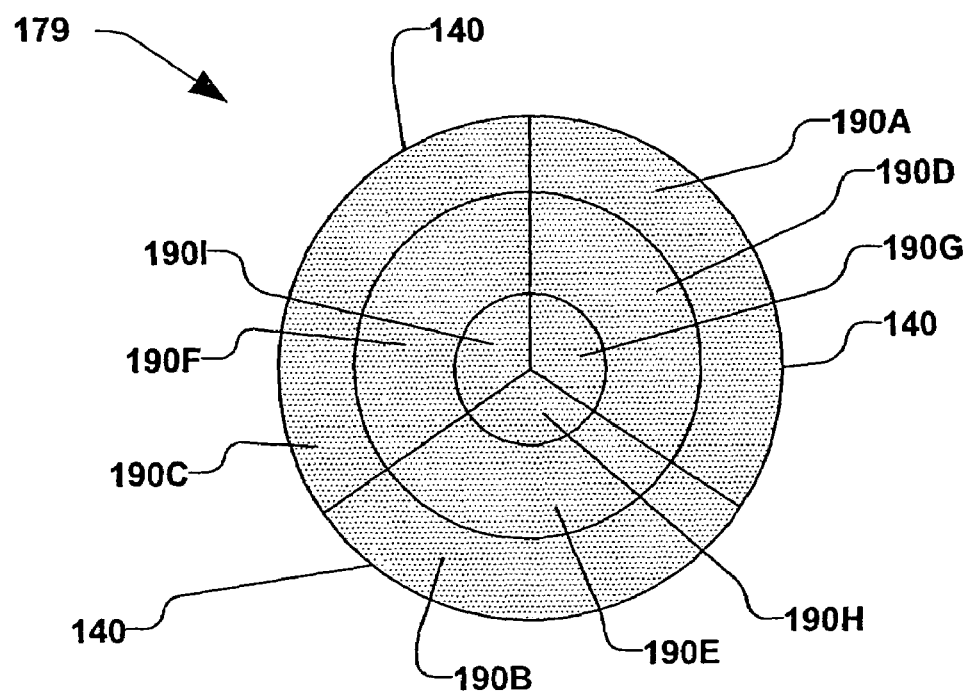
FIG. 10 is a simplified plan view of an exemplary cold plate comprising a plurality of zones according to the one aspect of the present invention.

According to yet another exemplary aspect of the invention, the cold plate 135, as illustrated in FIG. 10, can be divided into a plurality of zones 190A–190I, wherein an amount of the one or more gases (not shown) supplied to each zone can be individually controlled by the controller 152 of FIG. 2. Positioning the substrate (not shown) within 1 mm of the surface 145 of the cold plate 179 furthermore permits the substrate to be cooled in the viscous regime by thermal conduction through the one or more gases that are flowed to the cold plate. Such thermal conduction in the viscous regime provides a highly-efficient and tunable cooling scheme. Thermal conduction in the viscous regime can be advantageous over prior art cold plates which generally utilize thermal conduction of a cooling gas in the molecular regime. Under very low pressure (e.g., 1 millitorr to 10 millitorr), gas molecules behave in various regimes, depending on how the gas is confined. When the distance between the substrate 110 and the cold plate 120 illustrated in FIG. 2 is generally greater than a few microns, the behavior of gas molecules generally falls into the laminar, or viscous, flow regime, wherein the flow of the gas is characterized by a Newtonian response of the gas to some force. That is, the gas molecules acting in concert are compressible, have a density, viscosity, and when in motion, are characterized by a boundary layer flow field. In the molecular regime, gas molecules move independently within a volume, and the gas molecules change in motion, or vector, as a result of a collision. In the molecular regime, with distances less than a few microns (e.g., about 3 microns), a gas molecule will continue in motion until the molecule strikes some surface or another gas molecule, whereby the trajectory of the gas molecule is altered. Conduction of heat through a gas in the viscous regime, as defined by the present invention, can be more quickly controllable and efficient over the molecular regime, and is furthermore controllable to possibly a finer resolution in the plurality of zones 190 of FIG. 10. Although the zones 190A–190I of FIG. 10 are illustrated as radially extending zones, it should be understood that the zones may be configured in numerous ways, and in varying numbers, and such variations are contemplated as falling within the scope of the present invention.

According to another exemplary aspect of the present invention, as illustrated in FIG. 2, the thermal processing system 100 further comprises one or more temperature sensors 195 operable to measure one or more temperatures T at one or more respective locations (not shown) associated with the substrate 110. For example, the one or more temperature sensors 195 comprise one or more optical pyrometers, wherein the one or more optical pyrometers measure the one or more temperatures T through a window (e.g., quartz) in the cold plate 120. The one or more temperature sensors 195 may comprise, for example, a single pyrometer, or a multi-channel optical pyrometer, wherein the multi-channel optical pyrometer can measure the one or more temperatures T associated with a respective more than one locations on the substrate 110 through the one or more viewing ports or windows (not shown).

Alternatively, the temperature sensor 195 may comprise an optical pyrometer that may furthermore utilize fiber optic rods (not shown) inserted into the cold plate 120 such that a view of each pyrometer channel is restricted to a small area associated with the substrate 110. An adequate temperature profile of the substrate 110 can be achieved by one or more such temperature sensors 195, thereby providing the one or more temperatures associated with the substrate to the controller 152. Providing fiber-optic sensors (not shown) within the cold plate 120 to measure temperatures at the substrate is advantageous, in that numerous temperature sensors may be utilized in a small area, thereby increasing a resolution of the temperature profile across the substrate 110. Accordingly, each of the one or more temperature sensors 195 illustrated in FIG. 2, for example, is further operable to relay a signal 196 associated with the one or more measured temperatures T to the controller 152.

According to another exemplary aspect of the invention, the elevator 135 of FIG. 2 is operable to vary a distance D between the cold plate 120 and the substrate 110 based, at least in part, on the one or more measured temperatures T. Further, the elevator 135 illustrated in FIG. 4 may comprise an auxiliary temperature sensor 198 within a significantly hollow tube 199, whereby the temperature of the substrate 110 may be measured when the substrate is in the heating position.

According to yet another exemplary aspect of the invention, the controller 152 is operable to control an amount of gas supplied to the cold plate 135 via controlling the tunable gas source 185, wherein the control is based, at least in part, on the signal(s) 196 associated with the one or more measured temperatures T. Alternatively, the controller 152 is operable to control a mixture of two or more gases supplied to the cold plate 135 via controlling the tunable gas source 185, wherein the control is again based, at least in part, on the signal(s) 196 associated with the one or more measured temperatures T. Controlling a mixture of two or more gases supplied to the cold plate 120 advantageously controls an amount of thermal conduction through the mixture of thermally conductive and thermally non-conductive gases. For example, argon, which is a poor thermal conductor, can be mixed at varying proportions with helium, which is a good thermal conductor, thereby providing a thermal conductivity that reflects the mixture of the two gases. Such a mixture can further be utilized to fine tune the thermal profile of the substrate 110, and the proportions of each gas may also be modified by the controller 152.

According to another exemplary aspect of the present invention, the controller 152 generates one or more control signals to implement feedback control for controlling the cooling of the substrate 110. The control signals can comprise, for example, gas control signals sent to the tunable gas source 185 to control an amount or mixture of gases, as well as linear control signals sent to the elevator 135 to control the vertical position of the substrate 110. The controller 152 may comprise a closed-loop multi-channel feedback control system for use in process control. Control functions, for example, may furthermore be carried out by a general-purpose computer system.

One of the functions of the controller 152 is to relate data from the temperature sensors 195 and/or elevator assembly 135 to an optimal thermal profile of the substrate 110. In principle, with a few simplifying assumptions, the optimal thermal profile of the substrate 110 being cooled can be determined directly from the temperature measurements T. These temperature measurements T are then utilized to control the tunable gas source 185 uniformly or independently for the plurality of zones 190A–190I of FIG. 10. However, due to a potentially limited number of temperature sensors 195, as well as thermal and physical distortions or other factors, it may be more practical to create a database of thermal profiles corresponding to a range of known temperatures and distances, and to search the database for a match or acceptable correlation to the measured temperatures T associated with the substrate 110.

A database of thermal profiles can be generated experimentally or a priori (by calculation). Experimentally, a plurality of substrate samples can be cooled by the cold plate using various gas pressures and at varying distances from the sample substrates. Alternatively, various mixtures of gas composition may be experimentally obtained, and an experimentally generated database can then be utilized to determine control of the gas, although a large number of samples may need to be generated and characterized to obtain a database large enough to support the many combinations of gas mixtures and distances which may produce the optimal substrate thermal profile uniformity.

In accordance with another exemplary aspect of the present invention, the experimentally generated database may be employed to train a neural network. The controller 152, in this case, then comprises a neural network which is trained to determine the thermal profile based on the one or more measured temperatures T and the distance D between the cold plate 120 and the substrate 110, and then to subsequently determine an amount or mixture of gases to provide at each zone 190A–190I.

A priori approaches can also be employed to generate large databases, supporting various measured temperatures and distances of the cold plate 120 from the substrate 110. Given a description of the substrate 110, the cold plate 120, the process chamber 105, and other components, calculated thermal profiles can be generated by any one of several techniques. For example, a modeling technique such as a Classical Model Method (CMM), or a control algorithm can be employed in generating an a priori database.

After acquiring the one or more measured temperatures T, the controller searches the database for a match. A match may be defined in a statistical sense, such as, for example, Partial Least Squares or Minimum Mean Square Error. In a large database, several thermal profiles corresponding to similar measured temperatures T may provide a good match to the data, and therefore, the closest match may be selected. With a comparatively sparse database, the one or more measured temperatures T may fall between two database entries and an interpolation can be performed to determine the thermal profile. Consequently, the controller 152 can control the tunable gas source 185 and the elevator 135 to control the thermal conduction in each zone 190A–190I associated with the substrate 110, as well as controlling the distance D between the cold plate 120 and the substrate.

The present invention is also directed toward a method for thermally processing a semiconductor substrate. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Figure 11:
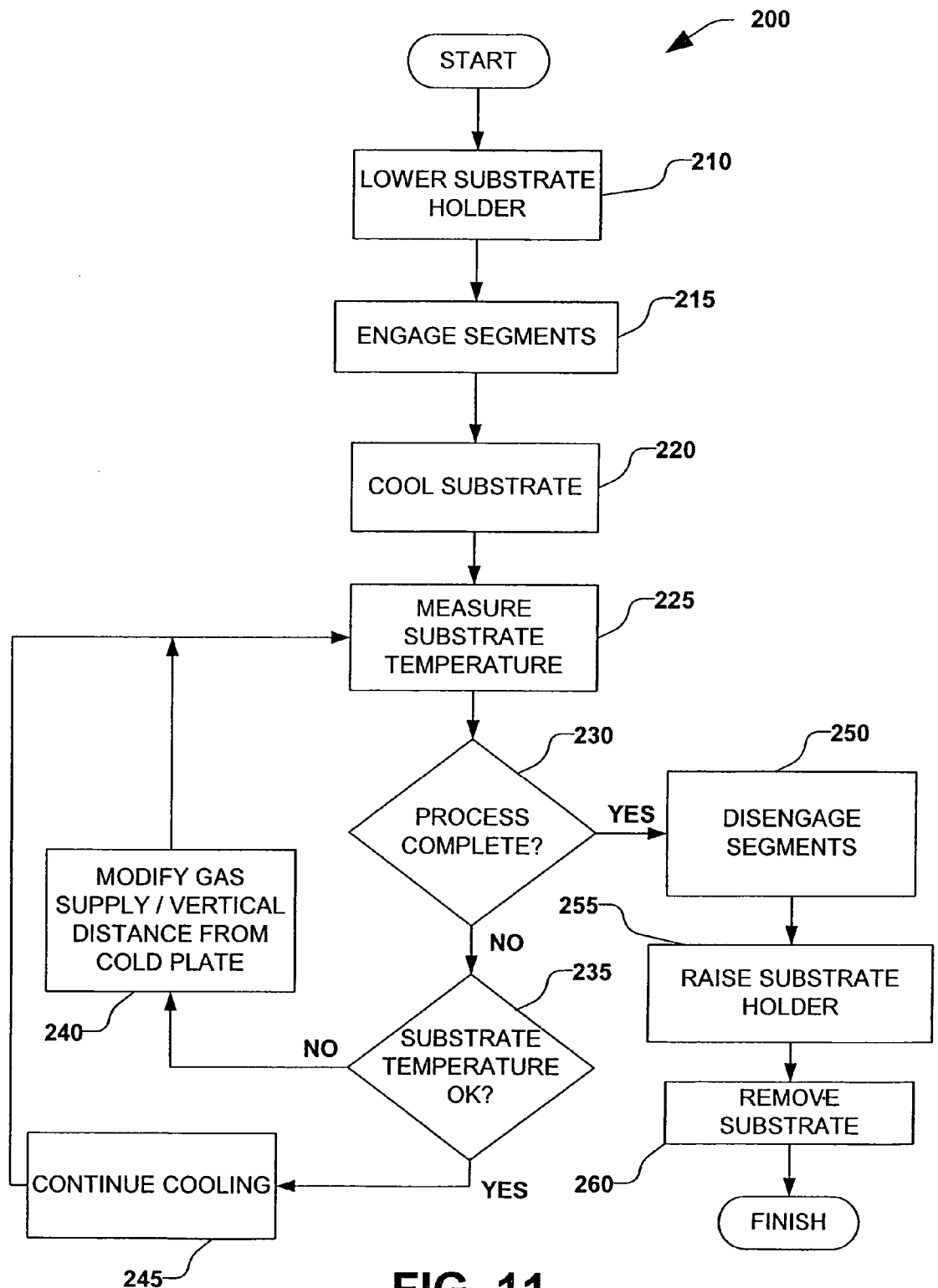
FIG. 11 is a flow chart diagram illustrating a methodology for thermally processing a semiconductor substrate according to the present invention.

FIG. 11 illustrates a method 200 of thermally processing a semiconductor substrate according to one exemplary aspect of the present invention. In act 210, a linearly-translating substrate holder is lowered from a heating position to a position above a cold plate when a plurality of segments of a cold plate are in a disengaged position. For example, a first portion of the substrate holder passes through one or more gaps between the plurality of segments of the cold plate, wherein a substrate residing upon the substrate holder remains above the cold plate. In act 215, the plurality of segments are engaged when the substrate holder is in a predetermined position. The plurality of segments converge upon one another, thereby minimizing the one or more gaps between the plurality of segments, while permitting the substrate holder to pass below the cold plate. For example, a plurality of pins protrude above a surface of the cold plate, wherein the pins support the substrate above the cold plate. In act 220, the substrate is cooled by thermal conduction of heat from the substrate to the cold plate.

According to one exemplary aspect of the present invention, in act 225, one or more temperatures associated with one or more respective locations on the substrate are measured, and a determination is made in act 230 as to whether the process is complete. If the determination made in act 230 is such that the process is not complete, another determination is made in act 235 as to whether the one or more measured temperatures are acceptable. If the one or more measured temperatures are determined to be unacceptable, a modification to one or more of the vertical distance of the substrate to the cold plate or an amount of one or more gases supplied to the cold plate are determined by a controller. For example, the modification to the amount of the one or more gases and/or the first distance are determined using a trained neural network, algorithm, or a model. The modification is then made to the vertical distance of the substrate to the cold plate or an amount of one or more gases supplied to the cold plate in-situ in act 240, thereby defining a second vertical distance of the substrate to the cold plate and/or a second amount of one or more gases supplied to the cold plate.

The process then continues to act 225, wherein the one or more substrate temperatures are measured again. If the determination in act 235 is such that the one or more measured temperatures are acceptable, no modification to the vertical distance of the substrate to the cold plate or an amount of one or more gases supplied to the cold plate are made, and the process continues by continuing cooling of the substrate in act 245. Subsequently, in act 225, the one or more substrate temperatures are measured again.

If the determination in act 230 is such that the process is complete (e.g., a predetermined amount of time has elapsed, or the wafer has cooled down to a predetermined temperature), the plurality of segments are disengaged in act 250. The substrate holder is moved back to the home position in act 255, and the substrate is subsequently removed from the process chamber in act 260. Although the description of moving the wafer to a cooling position in conjunction with a segmented cold plate, and dynamically monitoring and controlling a cooling of the wafer by varying a distance and/or gas composition mixture is provided in combination with FIG. 11, it should be understood that both processes may be employed independently of one another in accordance with the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for cooling a substrate residing on a substrate holder in a thermal processing chamber, wherein the thermal processing chamber comprises a cold plate comprised of a plurality of radially-movable segments, the plurality of segments having an engaged position and a disengaged position, wherein a generally spatially-continuous surface of the cold plate is defined when the plurality of segments are in the engaged position, and wherein one or more gaps are defined between the plurality of segments when the plurality of segments are in the disengaged position, the method comprising:

lowering the substrate holder from a first region of the process chamber above the cold plate to a second region of the process chamber proximate to the cold plate when the plurality of segments are in a disengaged position, wherein a first portion of the substrate holder passes through the one or more gaps between the plurality of segments, and wherein the substrate remains above the cold plate;

moving the plurality of segments into the engaged position after the substrate holder is at a predetermined position, wherein the plurality of segments converge upon one another, thereby minimizing the one or more gaps between the plurality of segments, and wherein a second portion of the substrate holder extends above the cold plate through one or more holes in the plurality of segments; and cooling the substrate by thermal conduction of heat from the substrate to the cold plate.

2. The method of claim 1, further comprising the acts of:

moving the plurality of segments into the disengaged position after cooling the substrate; and raising the substrate holder such that the first portion of the substrate holder is above the cold plate.

3. The method of claim 1, further comprising measuring one or more temperatures associated with one or more locations on the substrate while cooling the substrate.

4. The method of claim 3, further comprising the act of modifying the predetermined position based, at least in part, on the one or more measured temperatures.

5. The method of claim 3, further comprising:

flowing a predetermined mixture of two or more gases through the cold plate, whereby the substrate is cooled by thermal conduction of heat through the one or more gases; and modifying the predetermined mixture of the two or more gases based, at least in part, on the one or more measured temperatures.

6. The method of claim 5, further comprising determining an optimum mixture of the two or more gases which will provide generally uniform cooling at each of the one or more locations on the substrate where the one or more respective temperatures were measured.

7. The method of claim 1, further comprising flowing one or more gases through the cold plate, whereby the substrate is cooled by thermal conduction of heat through the one or more gases.

* * * * *